(12) United States Patent
Goruganthu et al.

(10) Patent No.: US 6,252,239 B1
(45) Date of Patent: Jun. 26, 2001

(54) SUBSTRATE REMOVAL FROM A SEMICONDUCTOR CHIP STRUCTURE HAVING BURIED INSULATOR (BIN)

(75) Inventors: Rama R. Goruganthu, Austin, TX (US); Richard Blish, II, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/584,818

(22) Filed: May 31, 2000

Related U.S. Application Data

(63) Continuation-in-part of application No. 09/050,531, filed on Mar. 30, 1998, now Pat. No. 6,069,366.

(51) Int. Cl.$^7$ .................................................. G01N 21/86
(52) U.S. Cl. ............................... 250/559.27; 219/121.4; 356/381
(58) Field of Search .......................... 250/559.27, 559.4, 250/559.29, 559.22; 356/376, 381; 219/121.19, 121.4, 121.37, 121.62; 216/89, 87

(56) References Cited

U.S. PATENT DOCUMENTS 5,731,697 * 3/1998 Liet et al. ........................... 324/71.5

\* cited by examiner

*Primary Examiner*—Que T. Le
(74) *Attorney, Agent, or Firm*—Crawford PLLC

(57) ABSTRACT

The present invention is directed to semiconductor chip analysis involving evaluation of a thickness of material in the chip, for example, as the chip is being thinned. According to an example embodiment of the present invention, a semiconductor die having a buried insulator (BIN) layer between a circuit side that is opposite a back side is analyzed. Light is directed at a selected area at the back side that is over a portion of material that has been reduced in thickness relative to the thickness of an unaltered die. The light has sufficient intensity to pass through the BIN layer and sufficient photon energy to cause the generation of electron-hole pairs in the die on the side of the BIN layer opposite the back side of the die. The electron-hole pairs generate an electrical output from the semiconductor die that is monitored and used to evaluate the thickness of the material.

36 Claims, 7 Drawing Sheets

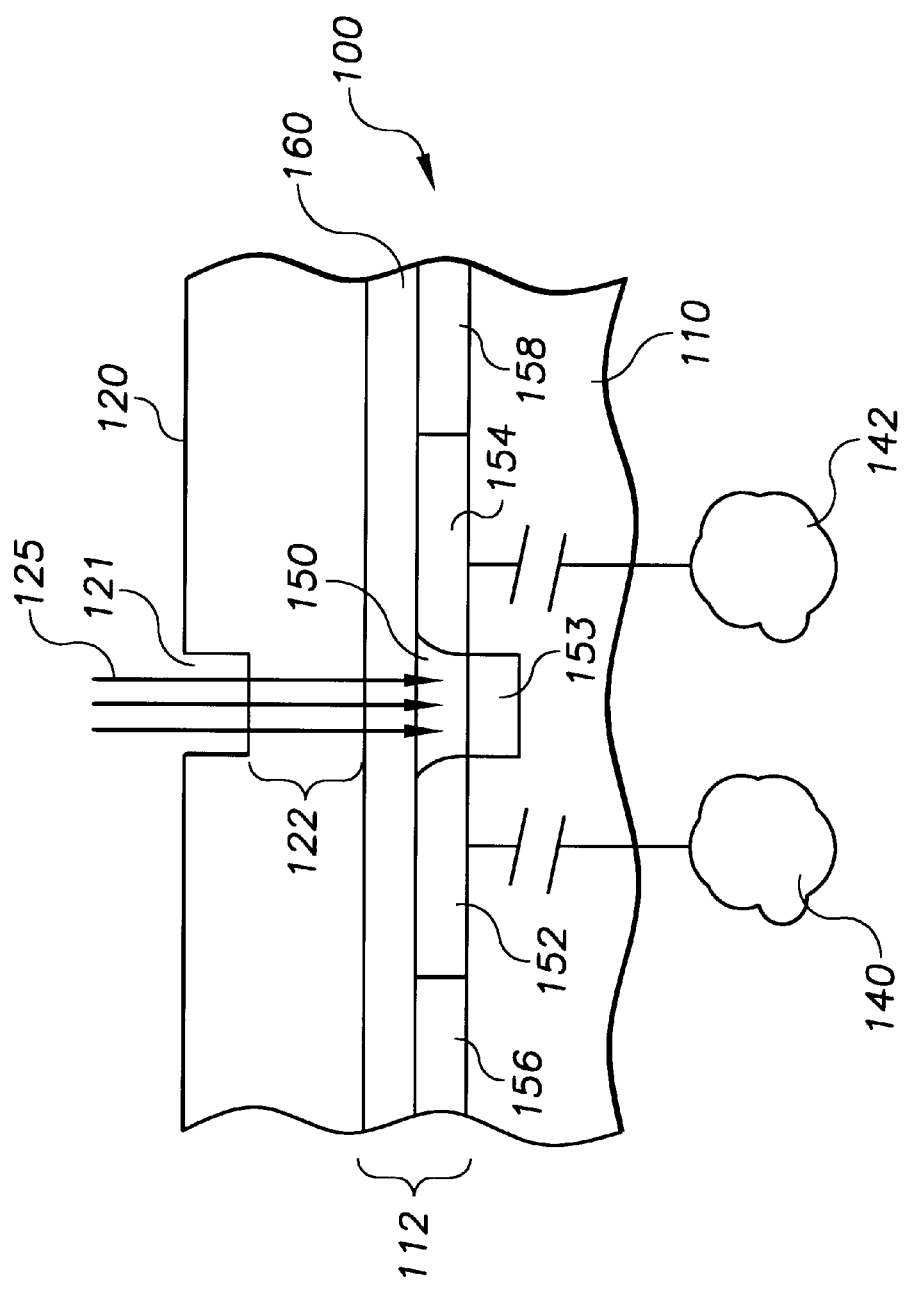

SUBSTRATE REMOVAL FROM A SEMICONDUCTOR CHIP STRUCTURE HAVING BURIED INSULATOR (BIN)

RELATED PATENT DOCUMENTS

The present invention is a continuation-in-part of U.S. patent application Ser. No. 09/050,531, filed on Mar. 30, 1998 and entitled "Endpoint Detection for Thinning of Silicon of a Flip Chip Bonded Integrated Circuit" now having U.S. Pat. No. 6,069,366 (AMDA.246PA/TT2317).

FIELD OF THE INVENTION

The invention relates to semiconductor device assemblies, and more particularly to techniques for analyzing and debugging circuitry associated with a flip chip bonded integrated circuit.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

To increase the number of pad sites available for a die, to reduce the electrical path to the pad sites, and to address other problems, various chip packaging techniques have been developed. One of these techniques is referred to as controlled collapse chip connection or "flip-chip" packaging. With packaging technology, bonding pads of the die include metal (solder) bumps. Electrical connection to the package is made when the die is "flipped" over and soldered to the package. Each bump connects to a corresponding package inner lead. The resulting packages are low profile and have low electrical resistance and a short electrical path. The output terminals of the package, which are sometimes ball-shaped conductive bump contacts, are typically disposed in a rectangular array. These packages are occasionally referred to as "Ball Grid Array" (BGA) packages. Alternatively, the output terminals of the package may be pins and such packages are commonly known as pin grid array (PGA) packages.

Once the die is attached to such a package the back side portion of the die remains exposed. The transistors and other circuitry are generally formed in a very thin epitaxially-grown silicon layer on a single crystal silicon wafer from which the die is singulated. The side of the die including the epitaxial layer and containing the transistors and other circuitry is often referred to as the circuit side or front side of the die. The circuit side of the die is positioned very near the package and opposes the back side of the die. Between the back side and the circuit side of the die is bulk silicon.

The positioning of the circuit side near the package provides many of the advantages of the flip chip. However, orienting the die with the circuit side face down on a substrate is disadvantageous in some instances. Due to this orientation of the die, the transistors and circuitry near the circuit side are not directly accessible for testing, modification or other purposes. Therefore, access to the transistors and circuitry near the circuit side is from the back side of the chip.

One particular type of semiconductor device that requires or at least benefits from accessing circuitry is a device having buried insulator (BIN) structure. Semiconductor dies including silicon-on-insulator (SOI) structure have such a BIN layer. SOI is created by forming an insulator, such as an oxide, over bulk silicon and then forming a thin layer of silicon on top of the insulator. After the silicon is formed over the insulator, circuitry is formed in the thin layer of silicon. The resulting SOI structure exhibits benefits including reduced switch capacitance, which leads to faster operation.

Techniques have been developed to access the circuitry even though it is buried under the bulk silicon. For example, near-infrared (nIR) microscopy is capable of imaging the circuitry because silicon is relatively transparent in these wavelengths of the radiation. However, because of the absorption losses of nIR radiation in silicon, it is generally required to thin the die to less than 100 microns in order to view the circuitry using nIR microscopy. For a die that is 725 microns thick, at least 625 microns of silicon is removed before nIR microscopy can be used.

Thinning the die for analysis of a flip chip bonded IC is usually accomplished by first globally thinning, wherein the silicon is thinned across the entire die surface. The silicon is globally thinned to allow viewing of the circuitry from the back side of the die using nIR microscopy. Mechanical polishing and chemical-mechanical polishing are two example methods for global thinning. Using nIR microscopy, an area is identified for accessing a particular area of the circuitry.

Once an area is identified as an area of interest and it is determined that access is needed to a particular area of the circuitry, local thinning techniques can be used to thin an area smaller than the die size. One method of local thinning, referred to as Laser microchemical etching, is typically accomplished by focusing a laser beam on the back side of the silicon surface to cause local melting of silicon in the presence of chlorine gas. The molten silicon reacts very rapidly with chlorine and forms silicon tetrachloride gas, which leaves the molten (reaction) zone.

During failure analysis or for design debug of a flip chip die having SOI structure, accessing circuitry generally involves removing substrate from the back side of the die to access a node, or milling to the node and subsequently depositing a metal on the node. Often, global and local thinning processes as described above are used to accomplish such substrate removal. Accurate control of the substrate removal process, however, is not readily achieved. The global and local thinning processes described above often involve abrasive or otherwise damaging methods. When not controlled properly, removing substrate from the back side of a flip chip die can result in damage to or destruction of circuitry and other substrate in the device. In addition, the milling process can be time-consuming, difficult to control, and expensive.

The need for a method for removing silicon is not eliminated by an approach where the back side is thinned to a distance away from the package to which the die is attached. Various part tolerances do not allow for such a simple solution to approaching the circuit side of the die from the back side of the die. One tolerance issue revolves around keeping the height of solder ball contacts on the die substantially uniform for every packaged device of a particular type. Even though the solder ball contacts have a tolerance requirement, when the solder is reflowed to attach the die to a package, the amount of change in height due to solder reflow can vary by several microns. The thickness of the die between the circuit side and back side is also subject to tolerance differences. Since the thickness of the starting silicon wafer is a non-essential parameter for making a functioning die, the die thickness is typically not accurately controlled and therefore not known.

Existing methods and systems for analyzing semiconductor chips having SOI structure would benefit from a method and/or system that makes possible such analysis without damaging the chip and while doing so in a cost-effective and efficient manner.

SUMMARY OF THE INVENTION

The present invention is directed to a method and system for evaluating a thickness of material in a semiconductor chip having silicon-on-insulator (SOI) structure between a circuit side that is opposite a back side. The thickness evaluation facilitates analysis of the chip and provides capabilities including controlled substrate removal. The present invention is exemplified in a number of implementations and applications, some of which are summarized below.

According to an example embodiment of the present invention, substrate is removed from the back side of a flip chip bonded die having a BIN layer. Light is directed at a selected area at the back side of the chip where substrate has been removed, and the light penetrates through the back side silicon and the BIN layer and into silicon beyond the BIN. The penetrated light generates electron-hole pairs in the chip. As more light penetrates the BIN, more electron-hole pairs are generated. The amount of light penetrating the BIN is related to the thickness of substrate through which the light must pass. Using the relationship of substrate thickness and electron-hole pair generation, an electrical parameter from the chip, which is at least in part affected by the electron-hole pairs, is monitored and used for evaluating a thickness of material in the chip.

According to another example embodiment of the present invention, a system is arranged for evaluating a thickness of a material between a selected area at a back side of a semiconductor die and a region in the die, wherein the die has a BIN layer between the back side and a circuit side. The system includes a light source adapted to direct light at the selected area at the back side of the die with sufficient intensity to pass through the BIN layer with sufficient photon energy, the light source generates electron-hole pairs in the die on the side of the BIN layer opposite the back side of the die. A monitoring device is adapted to monitor an electrical parameter of the die resulting from the electron-hole pair generation for evaluation of the thickness of the material.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description in connection with the accompanying drawings, in which:

FIG. 1A is a side view of the flip chip shown in FIG. 1 undergoing analysis, according to an example embodiment of the present invention;

Figure 1:
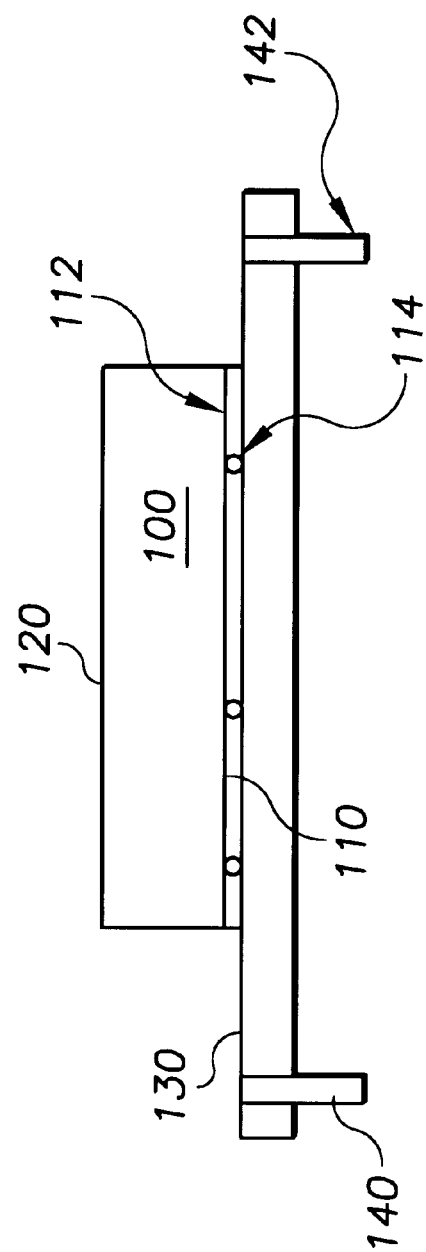
FIG. 1 shows a prior art side view of a flip chip packaged integrated circuit having SOI structure within.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types of semiconductor devices, and the invention has been found to be particularly suited for flip-chip and other type devices having an SOI implementation such as those including a buried insulator (BIN) layer, and also devices requiring or benefiting from analysis involving substrate thickness evaluation. While the present invention is not necessarily limited to such devices, various aspects of the invention may be appreciated through a discussion of various examples using this context.

According to an example embodiment of the present invention, a semiconductor chip having a BIN layer between a circuit side that is opposite a back side is analyzed. Substrate is removed from the back side of the chip and a thinned portion is formed, and a light beam is directed at a selected area at the back side over the thinned portion. The light has sufficient intensity to penetrate through the back side and through the BIN layer, and has sufficient photon energy to generate electron-hole pairs in a selected region of the chip on the side of the BIN layer opposite the back side. The electron-hole pair generation is related to the thickness of material through which the light must pass: as the thickness is reduced, more light passes through the BIN layer and more electron-hole pairs are generated. A monitoring device is used to detect an electrical parameter of the chip that is at least in part affected by the generated electron-hole pairs. The detected parameter is used to evaluate a thickness of the chip between the selected area at the back side and the selected region.

FIG. 1 shows a side view of a flip chip type die 100 having SOI structure between a circuit side 110 that is opposite a backside 120. The circuit side 110 includes a number of circuit devices formed near the circuit side in a portion of the die known as the epitaxial layer 112. The epitaxial layer 112 has a thickness in the range of 1 to 15 microns. A plurality of solder bumps 114 are made on the circuit side 110. The solder bumps 114 are the inputs and outputs to the circuitry associated with the die 100. The flip chip type die 100 is attached to a surface 130, such as a package for a flip chip, via the solder bumps 114. The surface 130 includes pads which are arranged to correspond to the pattern of solder bumps on the die 100. The pads are electrically connected to circuitry within the package and then to pins, such as pin 140 and pin 142. Pin 140 is $V_{DD}$ (power) for the package and pin 142 is $V_{SS}$ (common) for the package.

FIG. 1A shows the semiconductor chip of FIG. 1 undergoing analysis, according to an example embodiment of the present invention. The SOI structure includes a buried insulator (BIN) layer 160, such as an oxide, over which circuitry is formed (the circuitry is shown under the BIN layer in the flip chip application in FIG. 1A). The circuitry includes a transistor having source and drain regions 152 and 154 and a gate 153 formed over the BIN. The transistor is separated from adjacent devices by shallow trench isolation (STI) areas 156 and 158. A portion of substrate has been removed from the back side 120 and an exposed region 121 is formed over a thickness of remaining material 122 between the BIN and the exposed region. A laser beam 125 having a wavelength of about 1064 nanometers is directed at the exposed region 121 and passes through the remaining material 122 in the back side and the BIN layer 160 and into a selected region 150 below the gate 153.

The laser beam 125 generates electron-hole pairs in the selected region 150 and causes electrical activity in the transistor. The source and drain regions 152 and 154 are electrically coupled via circuitry to $V_{SS}$ and $V_{DD}$ connections 140 and 142. The electrical activity is detected by way of the pin connections and used to evaluate the remaining thickness 122 of material between the exposed region 121 and the BIN 160. The evaluation of the thickness of remaining material 122 is useful, for example, during substrate removal from the back side 120. By evaluating the thickness, the substrate removal can be evaluated and thereby controlled. Certain applications require that attention be directed to the detection or determination of the endpoint or stop point of the substrate removal process. By evaluating and monitoring the thickness of remaining material 122, substrate can be removed to expose a selected area, such as the selected region 150, without removing excess material and potentially damaging the transistor.

Figure 2:
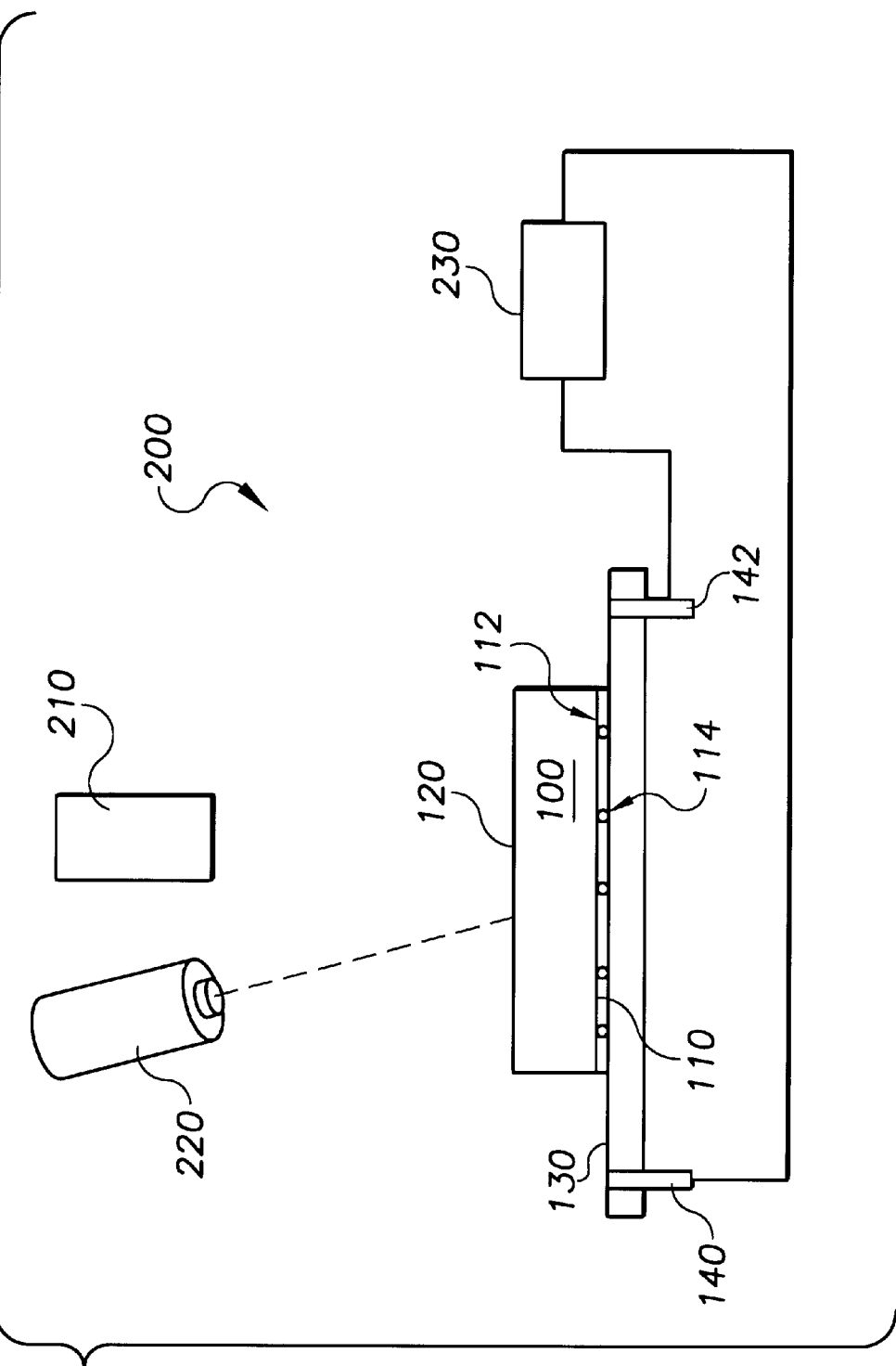
FIG. 2 shows a schematic view of a system for evaluating the distance to the active circuit of a flip chip attached to a substrate, according to another example embodiment of the present invention.

FIG. 2 shows a schematic view of a system 200 for evaluating a thickness of a selected region of a flip chip type die 100 having SOI structure and attached to a substrate or surface 130. The system includes a substrate removal tool 210 adapted to remove a portion of the die. The tool 210 can be used to globally thin the die across the back side 120, or to locally thin a selected portion of the back side 120 that is less in area than the entire area of the back side. The substrate removal tool 210 may include, for example, a typical global thinning tool such as a polishing device or a grinding device that removes silicon across the entire backside 120 surface, or a tool such as a laser etching device that can be used to locally thin a portion of the back side. In certain applications, the tool 210 includes a combination of tool functions, one of globally thinning and another that locally thins the die 100.

A light source 220 is arranged and adapted to direct light at the back side 120 in a manner such that light penetrates through the back side and into a selected region in the die having circuitry. The light source may, for example, include broad-spectrum light that produces a range of light frequencies, multiple wavelengths of light, or a laser that generally produces one wavelength of light (e.g., monochromatic light). The light source 220 causes the generation of electron-hole pairs that induce current in the channel region (and at any parasitic p-n junction) in the chip, commonly referred to as optical beam-induced current (OBIC). The OBIC is produced when p-n junctions in the chip are exposed to light of photon energy higher than the bandgap of silicon (1.1 eV). One example light source useful for generating OBIC includes green light from an Nd:YAG laser at a preset power level and having a wavelength of about 1064 nanometers. In other embodiments, alternative sources include diode lasers in the wavelength range 680 to 950 nanometers. A monitoring device 230 is adapted to detect an electrical output from the die via pins 240 and 242 that are coupled to circuitry in the chip through electrical interconnects and package bonding. The electrical output is affected by the induced current, and is used in connection with evaluating a thickness of a portion of the chip.

The monitoring device 230 may, for example, include a transimpedance amplifier adapted to measure current and to convert the measured current to a voltage that can be recorded. The recorded voltage is used as an indication of the thickness of substrate in the back side through which the directed light passed before reaching circuitry and inducing current in the chip. Many transimpedance amplifiers suitable for use in connection with this example embodiment do not introduce a significant bias voltage across the $V_{SS}$ and $V_{DD}$ pins, making the measured current closely indicative of the signal generated by the OBIC. However, some amplifiers introduce a bias voltage significant enough to exceed the threshold voltage for conduction in the p-n junctions. In this instance, the measured current is a sum of the OBIC component of the current generated by the light source and the diode (junction) current generated by the transimpedance amplifier. Hence, the measured signal is not completely reflective of the OBIC signal, and the added current from the transimpedance amplifier is taken into consideration when measuring the OBIC signal.

In addition to or as an alternative to a transimpedance amplifier, other devices suitable for use in connection with monitoring the chip can be used. For example, an oscilloscope can be used to convert current to voltage using its input impedance. In another example, a known resistor is coupled to the chip and used to measure the current by determining the voltage drop across the resistor using a voltmeter and determining the current therefrom.

When the thickness of material through which the light from the source 220 passes before penetrating the BIN and generating OBIC is relatively large (e.g., greater than 100 microns), little or no OBIC is generated. As the silicon in the back side is thinned, the thickness through which the light passes is reduced, allowing more light to reach circuitry in the device. As more light reaches the circuitry, more electron-hole pairs are generated in a depletion region of the circuitry, thereby generating more current. This increased current corresponds to, and is used as an indication of the thickness of material remaining in the back side of the chip. As substrate is removed, an operator or an automatic controller can use the indicated thickness to control the removal process, such as by controlling the removal rate or by stopping the process when it reaches an endpoint.

Figure 3:
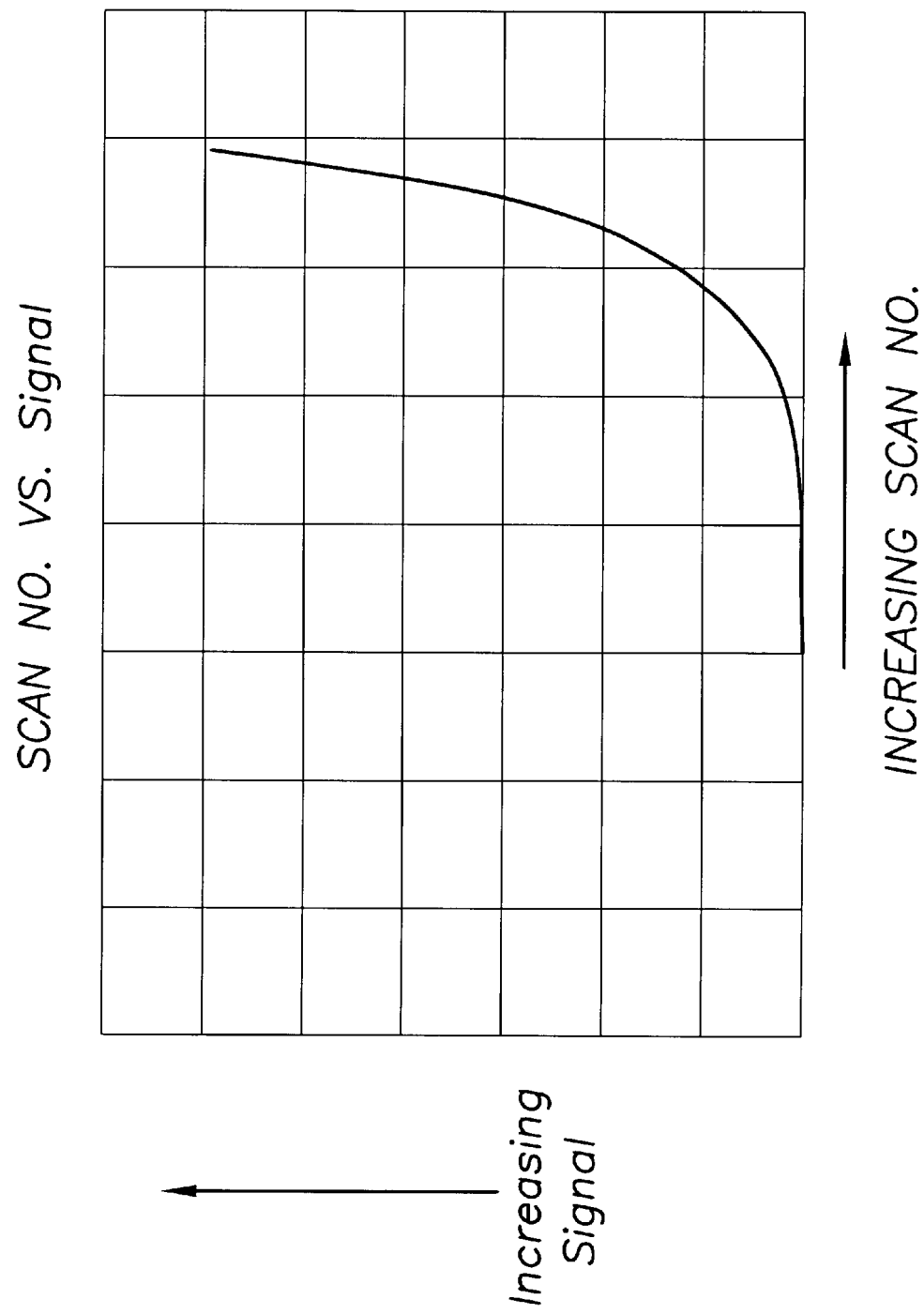
FIG. 3 shows a plot of an optical beam induced current signal measured from the active circuit on a flip chip as silicon is progressively removed from the back side of the flip chip, according to another example embodiment of the present invention.

FIG. 3 is an example plot of an OBIC signal measured from a flip chip, such as the chip of FIGS. 1, 1A, and 2, as silicon is progressively removed from the back side of the chip. The chip is scanned as substrate is removed, and the increasing scan number corresponds with additional substrate being removed from the chip. The OBIC signal is a function of the amount of light reaching the junction, and increases dramatically as more light penetrates the thinned substrate.

The plot of FIG. 3 can be mathematically described. The amount of light reaching the junction region is attenuated by absorption losses in silicon and is known to follow Beer's law. The attenuation is strongly dependent upon the silicon thickness according to the following equation:

I=(-αt), where
I=the intensity of light,
$I_0$=the intensity of light incident on the back surface,
α=the absorption coefficient, and
t=the thickness of the absorbing medium.

Using Beer's Law, the thickness of the absorbing medium (e.g. the silicon between the backside 120 and circuitry in the chip) can be monitored by observing the OBIC signal. Thus, the thickness of silicon in a semiconductor chip can be quantified.

The absorption coefficient "α" is dependent upon the type of material and the wavelength of light used. The OBIC signal strength is directly proportional to the amount of light reaching the junction area (the attenuated light intensity). Hence, OBIC is a function of the incident light intensity and the silicon thickness while the other parameters, such as absorption coefficient and light wavelength, are fixed. If the starting silicon thickness is $t_0$, the OBIC signal S can be modeled as:

$$S = A\exp(-\alpha(t_0 - t_r)),$$

where $t_r$ is the thickness of silicon removed, A is a proportionality constant, and $(t_0-t_r)$ is the thickness of remaining silicon. From this data it is clear that the OBIC signal can be monitored and used for controlling the removal of silicon using virtually any type of removal process. By monitoring the OBIC signal, the substrate removal can be controlled relative to the strength of the OBIC signal.

For example, a graph such as FIG. 3 can be made for a test chip, and the thickness corresponding to signal can be measured using a particular type of light source. Using the graph and the same type of light, substrate removal from additional chips having structure similar to the test chip can be controlled based upon a measured signal strength and correlation of that signal strength with the graph.

Figure 4:
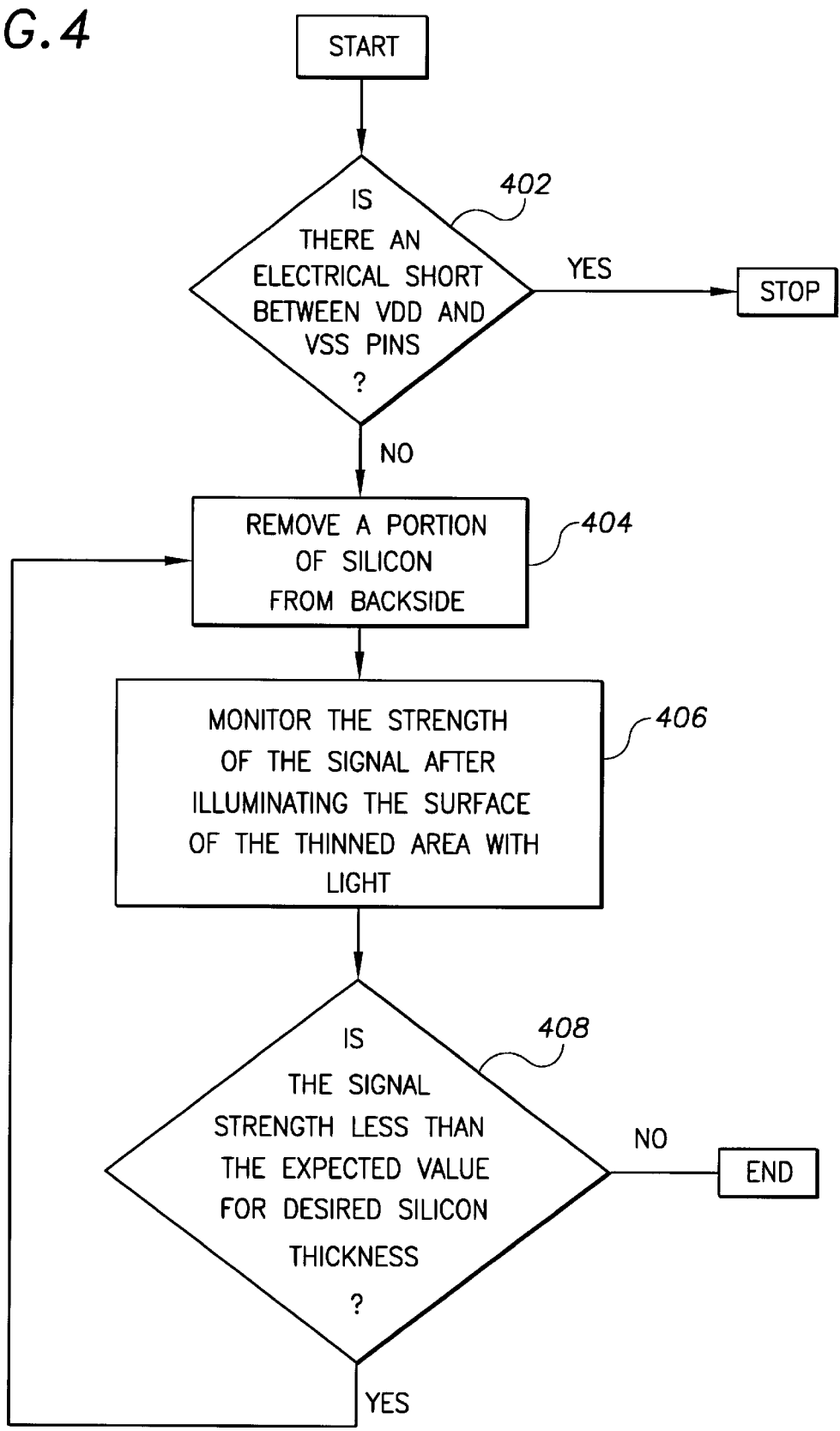
FIG. 4 is a flow diagram of the method for evaluating a signal for detection of an endpoint of the silicon removal, according to another example embodiment of the present invention.

FIG. 4 is a flow diagram of a method for monitoring an OBIC signal and controlling substrate removal from a semiconductor chip having circuitry on a BIN layer, according to another example embodiment of the present invention. The chip is attached to a chip package having $V_{SS}$ and $V_{DD}$ pins electrically coupled via interconnects to circuitry in the chip. First, it is determined whether there is an electrical short between $V_{SS}$ and $V_{DD}$ pins of the package at block 402. The existence of an electrical short may, for example, be determined by measuring the resistance across the pins while applying a voltage of less than 0.1V. If the resistance is large (e.g., greater than 100 Ohms) there is no short. If the resistance is small, there is a likely short. If there is no electrical short between the pins, a portion of silicon from backside is removed at block 404. The surface of the area having substrate removed is illuminated using a light source sufficient to penetrate the oxide layer and generate electron-hole pairs beyond the penetrated oxide, and the strength of the signal induced by the light is monitored at block 406. The signal is compared with an expected value for a desired silicon thickness at block 408. If the strength is less than the expected value, the substrate removal continues at block 404. If the strength is equal to or greater than the expected value, the substrate removal process is stopped.

Figure 5:
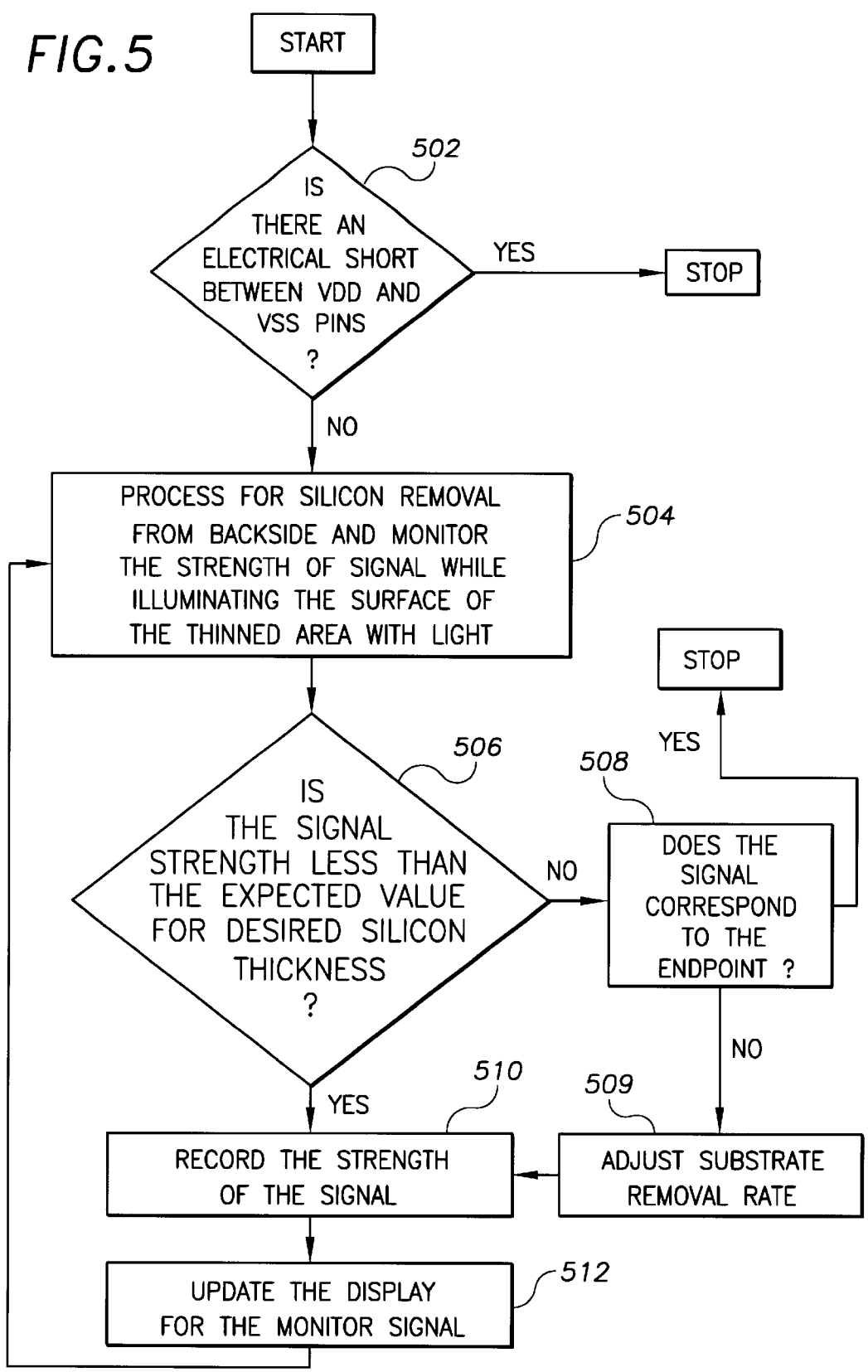
FIG. 5 is a flow diagram for in-process evaluation of a signal for controlling substrate removal, according to another example embodiment of the present invention.

FIG. 5 is a flow diagram of a method for monitoring an OBIC signal and controlling substrate removal from a semiconductor chip having circuitry on a BIN layer, according to another example embodiment of the present invention. The chip is attached to a chip package having $V_{SS}$ and $V_{DD}$ pins electrically coupled via interconnects to circuitry in the chip. First, it is determined whether there is an electrical short between $V_{SS}$ and $V_{DD}$ pins of the package at block 502. If there is no electrical short between the pins, silicon is removed from the back side of the chip at block 504.

As the backside of the chip is thinned, light is exposed to the area being thinned and induces a signal that is monitored. If the signal strength is less than the expected value for the desired thickness at block 506, the strength is recorded at block 510, the display of a monitor for the signal is updated at block 512, and the substrate removal process is continued at block 504. If the signal strength is equal to or greater than the signal strength associated with a desired thickness, it is determined whether the signal strength corresponds to the endpoint of the substrate removal process at block 508. If the endpoint has been reached, the substrate removal process is terminated. If an endpoint has not been reached, the substrate removal rate is adjusted accordingly at block 509, and the process continues at block 510. The removal-rate adjustment, for example, may be used to slow the removal process as the endpoint is neared in order to better detect the endpoint and to avoid removing too much substrate. In this manner, closed-loop process control is achieved.

Figure 6:
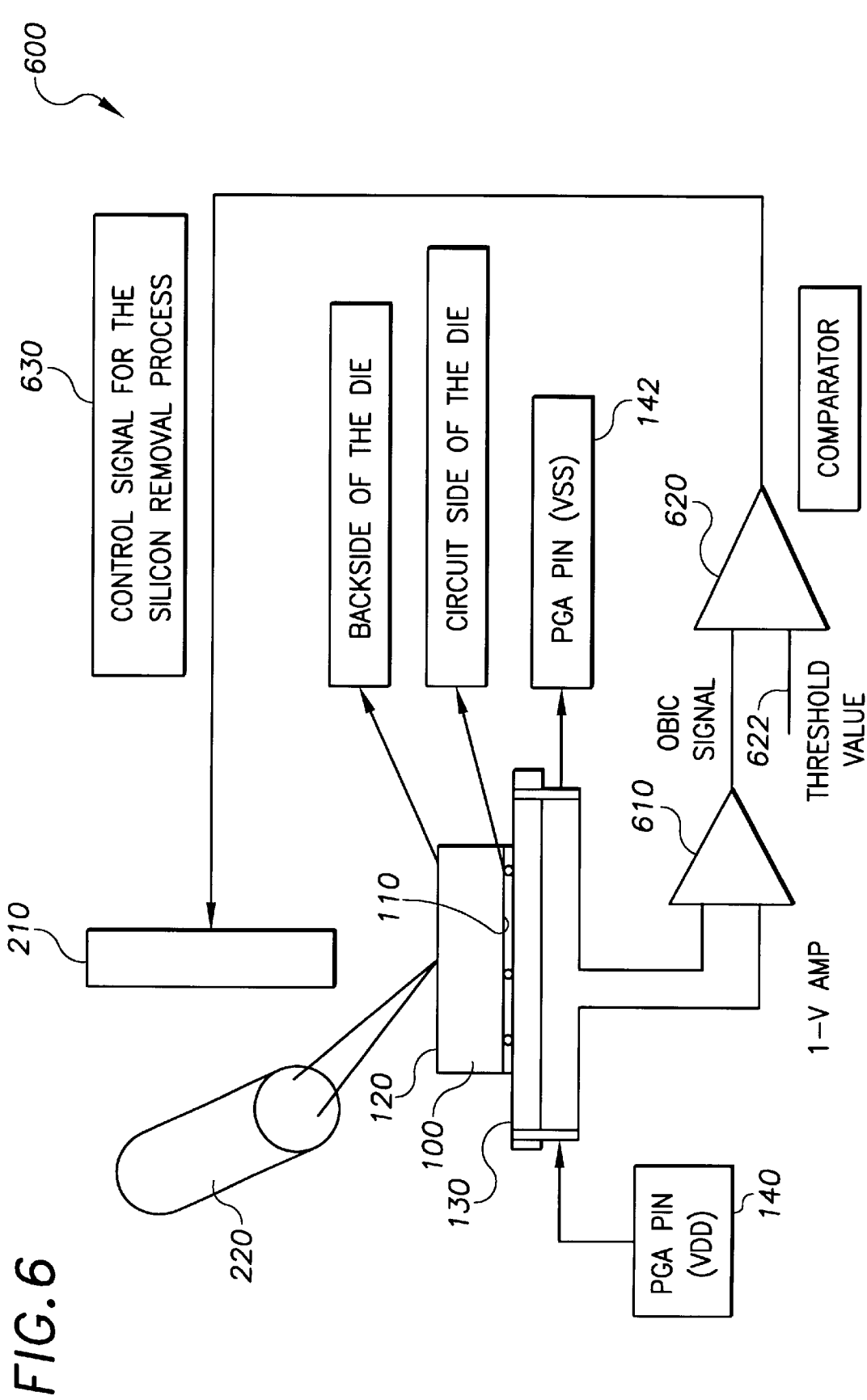
FIG. 6 is a schematic implementation of the system for closed loop control for substrate removal, according to another example embodiment of the present invention.

FIG. 6 is an electronic schematic implementation of a system 600 adapted to remove substrate from a semiconductor chip, such as by carrying out the process discussed in connection with FIG. 5. The system includes a light source 220 adapted to illuminate a selected area at a back side 120 of a semiconductor chip 100 having circuitry formed on a BIN layer. The light source, for example, may include a broad-spectrum type of light that produces a range of light frequencies, a laser that generally produces monochromatic light, or a combination thereof. The light source is adapted to illuminate the chip with light having sufficient characteristics to penetrate the BIN and generate electron-hole pairs in a selected region of circuitry formed on the BIN. The light source may, however, not sufficiently penetrate the BIN to generate electron-hole pairs until a portion of substrate has been removed from the back side 120. This is acceptable because the control of the substrate removal process is not necessarily essential when the amount of substrate in the back side is thick enough to prevent the penetration of the light. Controlling the removal process becomes more beneficial as the substrate removal process approaches the circuitry in the chip. One type of light suitable for use in connection with this example embodiment includes laser light having a wavelength of about 1064 nanometers.

A transimpedance amplifier 610 is coupled and adapted for measuring an electrical signal from the pins $V_{SS}$ 142 and $V_{DD}$ 140. The strength of the signal at the pins 140 and 142 is indicative of the distance between the circuitry or devices and the back side of the chip: as substrate is removed, the signal increases. The output from the amplifier 610 is input to a comparator 620. The comparator 620 compares the signal output from the transimpedance amplifier 610 to a threshold value that is also input to the comparator on line 622. When the output from the transimpedance amplifier 610 equals or exceeds a threshold value on line 622, a control signal 630 is output to a substrate removal tool 210. When the threshold value corresponds to a point in the substrate removal process where it is desirable to adjust the removal rate, the control signal is adapted to cause the silicon removal tool 210 to adjust the removal rate, such as by reducing the power. When the threshold corresponds to the endpoint of the removal process, the control signal 630 is adapted to stop the removal tool 210 from removing additional silicon from the backside 120 of the flip chip 100, such as by turning the power off.

In an alternative example embodiment of the present invention, the system 600 further includes a computer arrangement adapted to receive the signal from the amplifier 610 and to control the substrate removal process. For example, the computer can be programmed with preset threshold values. When a threshold value is reached, the computer sends a control signal to the substrate removal tool. The computer can be used to store data acquired from the chip, and also to display the data in a viewable format, such as a graph like the one shown in FIG. 3. The computer may also be further coupled to an integrated manufacturing system via a communications line and a system such as the Internet or a network.

Accordingly, various embodiments of the present invention make possible the analysis of semiconductor devices having BIN without damaging the chip and while doing so in a cost-effective and efficient manner.

While the present invention has been described with reference to several particular example embodiments, those skilled in the art will recognize that many changes may be made thereto without departing from the spirit and scope of the present invention, which is set forth in the following claims.

What is claimed is:

1. A method for evaluating a thickness of a material between a selected area at a back side of a semiconductor die and a region in the die, the die having a buried insulator (BIN) layer between a circuit side that is opposite the back side, and the back side having at least one thickness, the method comprising:
   directing light at a selected area at the back side of the die to pass through the BIN layer and to generate electron-hole pairs in the die on the side of the BIN layer opposite the back side of the die; and
   evaluating said at least one thickness as a function of the generated electron-hole pairs.

2. The method of claim 1, wherein evaluating said at least one thickness includes monitoring an electrical parameter of the semiconductor die and evaluating the thickness of the material, the electrical parameter being responsive to the directed light, and wherein directing light includes providing the directed light with sufficient photon energy to cause the generation of electron-hole pairs.

3. The method of claim 2, wherein evaluating said at least one thickness includes correlating the electrical parameter to the thickness of the material between the selected area at the back side of the die and the region in the die.

4. The method of claim 1, wherein directing light at the selected area includes pulsing the light, and wherein evaluating said at least one thickness includes synchronizing the phase of an electrical response from the die with the pulsed light.

5. The method of claim 2, wherein the die is bonded to a package having power and common pins, and wherein monitoring an electrical parameter includes measuring a signal across the power and common pins.

6. The method of claim 1, wherein directing light at a selected area at the back side of the die includes generating electron-hole pairs in a depletion region below a transistor.

7. The method of claim 1, further comprising reducing the thickness of the portion of the die between the selected area and the region, relative to an unaltered back side, prior to directing light at the selected area.

8. The method of claim 7, wherein directing light at a selected area at the back side of the die includes the reducing the thickness of the portion of the die between the selected area and the region.

9. The method of claim 7, wherein reducing the thickness of the portion of the die between the selected area and the region includes removing a portion of material between the region in the die and the selected area at the back side at a controlled removal rate, further comprising, responsive to evaluating said at least one thickness, varying the rate at which material is removed.

10. The method of claim 9, wherein varying the rate at which material is removed includes using feedback loop control.

11. The method of claim 9, further comprising slowing the rate at which material is removed as the thickness of the material between the region in the die and the selected area at the back side of the die lessens.

12. A method for removing substrate from a semiconductor die having SOI structure including a buried insulator (BIN) layer between circuitry in a circuit side of the die that is opposite a back side of the die, the method comprising:
   removing a portion of the substrate and forming an exposed region;
   directing light toward the exposed region to pass through the BIN layer and causing the generation of optical beam induced current (OBIC) in the circuitry;
   detecting an electrical output of the circuitry and evaluating therefrom a thickness of substrate between a region in the die and the exposed region; and
   responsive to the evaluated thickness, controlling the substrate removal process.

13. A method according to claim 12, wherein removing a portion of the substrate and directing light toward the exposed region are performed simultaneously by etching the substrate with a laser etching device.

14. A method according to claim 12, wherein removing a portion of the substrate includes laser etching, and wherein directing light toward the exposed region includes directing a secondary light source toward the exposed region.

15. A method according to claim 14, wherein the secondary light source includes a laser light source.

16. A method according to claim 12, wherein removing a portion of the substrate is performed at a controllable removal rate, and wherein controlling the substrate removal process comprises controlling the substrate removal rate as a function of the evaluated thickness of the substrate.

17. A method according to claim 16, wherein controlling the substrate removal rate as a function of the evaluated thickness of the substrate includes terminating the substrate removal rate responsive to determining a thickness corresponding to an endpoint of the substrate removal process.

18. A method according to claim 16, wherein controlling the substrate removal rate as a function of the evaluated thickness of the substrate includes adjusting the substrate removal rate responsive to reaching a first thickness threshold defined as a function of the semiconductor die and the substrate removal process.

19. A method according to claim 18, wherein adjusting the substrate removal rate includes reducing the substrate removal rate responsive to approaching the endpoint of the substrate removal process.

20. A method according to claim 12, wherein removing a portion of the substrate and forming an exposed region includes removing a portion of substrate from the back side of the die.

21. A method according to claim 12, wherein removing a portion of the substrate in the die and forming an exposed region includes removing a portion of substrate from the circuit side of the die.

22. A method for removing substrate from the back side of a semiconductor die having SOI structure including a buried insulator (BIN) layer between a circuit side of the die that is opposite a back side of the die, the method comprising:

placing the die in a test arrangement having a laser device, a substrate removal device, and an electrical monitoring device;

using the substrate removal device and removing a portion of the substrate in the back side of the die;

using the laser device and directing a laser beam having a wavelength of about 1064 nm at a selected area at the back side of the die to pass through the BIN layer and generating electron-hole pairs in the SOI structure;

using the monitoring device and monitoring an electrical parameter of the die, the electrical parameter being responsive to the generated electron-hole pairs; and using the monitored electrical parameter of the die and controlling the substrate removal device.

23. A system for evaluating a thickness of a material between a selected area at a back side of a semiconductor die and a region in the die, the die having a buried insulator (BIN) layer between a circuit side that is opposite the back side, the back side having at least one thickness, the system comprising:

means for directing light at a selected area at the back side of the die to pass through the BIN layer and to generate electron-hole pairs in the die on the side of the BIN layer opposite the back side of the die; and means for evaluating said at least one thickness as a function of the generated electron-hole pairs.

24. A system for evaluating a thickness of a material between a selected area at a back side of a semiconductor die and a region in the die, the die having a buried insulator (BIN) layer between a circuit side that is opposite the back side, the back side having at least one thickness, the system comprising:

a light source adapted to direct light at a selected area at the back side of the die to pass through the BIN layer and to generate electron-hole pairs in the die on the side of the BIN layer opposite the back side of the die; and a monitoring device adapted to evaluate said at least one thickness as a function of the generated electron-hole pairs.

25. The system of claim 24, wherein the light source is broad beam in the wavelength range between about 650 and 1070 nanometers.

26. The system of claim 24, wherein the light source is monochromatic.

27. The system of claim 26, wherein the light source includes a laser in the wavelength range between about 680 to 950 nanometers.

28. The system of claim 27, wherein the laser has a wavelength of about 1064 nanometers.

29. The system of claim 24, wherein the light source is adapted to direct light at a selected area at the back side of the die to pass through a BIN layer having oxide.

30. The system of claim 24, wherein the die includes at least one semiconductor device formed in an epitaxial layer of the die, the system further comprising an optic tool adapted to view the at least one semiconductor device.

31. The system of claim 30, wherein the optic tool uses infrared microscopy.

32. The system of claim 24, wherein the monitoring device is adapted to monitor an electrical parameter of the die.

33. The system of claim 24, further comprising a substrate removal tool adapted to remove substrate from the back side of the die.

34. The system of claim 33, further comprising an information handling system adapted to control the substrate removal tool.

35. The system of claim 34, wherein the information handling system is coupled to the monitoring device and adapted to use the evaluated thickness for controlling the substrate removal tool.

36. The system of claim 24, further comprising a test arrangement including a substrate removal device, the light source, and the monitoring device.

* * * * *